(12) United States Patent
Cheng et al.

(10) Patent No.: US 8,801,908 B2
(45) Date of Patent: Aug. 12, 2014

(54) COMPOSITE INSULATING LAYER AND MANUFACTURING METHOD THEREOF

(75) Inventors: Chuan-Li Cheng, Taipei (TW); Chao-Lun Liu, Taipei (TW); Chih-Feng Hsu, Taipei (TW)

(73) Assignee: Chenming Mold Ind. Corp., Taipei (TW)

( * ) Notice: Subject to any disclaimer, the term of this patent is extended or adjusted under 35 U.S.C. 154(b) by 153 days.

(21) Appl. No.: 13/524,229

(22) Filed: Jun. 15, 2012

(65) Prior Publication Data

US 2013/0171464 A1 Jul. 4, 2013

(30) Foreign Application Priority Data

Dec. 28, 2011 (TW) .............................. 100149302 A

(51) Int. Cl.
*C23C 28/00* (2006.01)
(52) U.S. Cl.
USPC ............... 204/484; 205/188; 439/68; 439/55; 428/600; 428/172
(58) Field of Classification Search
CPC ...... H01R 12/585; H01R 12/00; H01R 13/03; B32B 3/30; B32B 7/02
USPC ....... 204/484; 205/188; 439/68, 55; 428/600, 428/172
See application file for complete search history.

(56) References Cited

U.S. PATENT DOCUMENTS

| 4,022,943 | A | 5/1977 | Erb et al. |
| 4,166,876 | A | 9/1979 | Chiba et al. |
| 2006/0294272 | A1 * | 12/2006 | Chou et al. ...................... 710/62 |
| 2007/0259540 | A1 * | 11/2007 | Taylor ............................. 439/68 |
| 2009/0124100 | A1 | 5/2009 | Mason et al. |

FOREIGN PATENT DOCUMENTS

| DE | 19606706 A1 | 8/1997 |
| EP | 1218178 B1 | 1/2004 |

\* cited by examiner

*Primary Examiner* — Xiuyu Tai
(74) *Attorney, Agent, or Firm* — Wang Law Firm, Inc.; Li K. Wang; Stephen Hsu

(57) ABSTRACT

A composite insulating layer and a manufacturing method thereof. The composite insulating layer includes a socket substrate, a connection layer disposed on the socket substrate, a conductive metal layer disposed on the connection layer, an insulating metal layer disposed on the conductive metal layer, an insulating ceramic layer disposed on the insulating metal layer, and a electrodeposition layer disposed on the insulating ceramic layer. The composite insulating layer of the present invention can avoid the electromagnetic interference generated from the pins of the CPU and increase the stability of the CPU.

10 Claims, 10 Drawing Sheets

COMPOSITE INSULATING LAYER AND MANUFACTURING METHOD THEREOF

CROSS-REFERENCE TO RELATED APPLICATION

This application claims the benefit of Taiwan Patent Application No. 100149302, filed on Dec. 28, 2011, in the Taiwan Intellectual Property Office, the disclosure of which is incorporated herein in its entirety by reference.

BACKGROUND OF THE INVENTION

1. Field of the Invention

The present invention relates to an insulating layer, and more particularly to a composite insulating layer capable of preventing electromagnetic interference and its manufacturing method.

2. Description of the Related Art

Electromagnetic radiation generated by advanced electronic products on the markets is mainly a high speed digital clock signal. Electromagnetic interference (EMI) may be generated in accordance with increased clock frequencies. It does not seriously interfere with communication, but can also influence the operation of other products in the environment to endanger human bodies potentially.

When a current passes through circuits of electronic components in an electronic product, an electromagnetic field is generated. The electromagnetic field irradiates outwards from electric wires. The magnetic field strength depends on the frequency and magnitude of the current. Surplus byproducts are so called EMI beyond the function required for any electronic circuit. In common knowledge, wireless communication devices, such as a mobile phone, may generate EMI. Further, electronic devices, such as personal computers, personal digital assistants, copy machines, scanners and digital cameras may also generate electromagnetic radiation during the operation process even if they are not radio frequency communication systems.

Since semiconductor technique and photography process are gradually advanced, the size of electronic components are greatly reduced. More and more transistors are placed into a central processing unit (CPU). To enhance the operation speed and processing efficiency of the CPU, pins of the CPU are increased. Consequently, when the CPU is operating, huge EMI is generated between pins. The EMI may influence the outside environment (including the operating adjacent to computers and the harm of human bodies).

Therefore, it lacks for an insulating layer capable of preventing electromagnetic interference to apply in the CPU.

Due to the EMI generated between the CPU pins in prior arts, a composite insulating layer capable of preventing electromagnetic wave and its manufacturing method are developed to effectively interfere with split electromagnetic wave generated by the CPU pins during the operation process, thereby preventing electromagnetic interference between pins and enhancing the stability of the CPU.

SUMMARY OF THE INVENTION

In view of the shortcomings of the prior art, the inventor(s) of the present invention based on years of experience in the related industry to conduct extensive researches and experiments, and finally developed a composite insulating layer and its manufacturing method as a principle objective to overcome the problem of electromagnetic interference generated between CPU pins during the operating process, resulting in the effect of an unstable CPU. The invention is to sequentially dispose a connection layer, a conductive metal layer and an electrodeposition insulating layer on a socket substrate, wherein the electrodeposition insulating layer can be effectively applied in sockets of a CPU to effectively prevent electromagnetic interference between pins.

To achieve the foregoing objective of the invention, a composite insulating layer comprises a socket substrate, a connection layer disposed on the socket substrate, a conductive metal layer disposed on the connection layer and an electrodeposition insulating layer disposed on the conductive metal layer.

Preferably, a material of the electrodeposition insulating layer can comprise one of an epoxy resin, an acrylic resin, an acrylic compound, a polyurethane or a combination thereof.

Preferably, the composite insulating layer further comprises an insulating metal layer that is disposed between the conductive metal layer and the electrodeposition insulating layer. The composite insulating layer further comprises an insulating ceramic layer that is disposed between the insulating metal layer and the electrodeposition insulating layer.

Preferably, the composite insulating layer further comprises an insulating ceramic layer that is disposed between the conductive metal layer and the electrodeposition insulating layer.

Preferably, a thickness scope of the connection layer is greater than 0 μm and smaller than or equal to 1 μm; and a thickness scope of one of the conductive metal layer, the insulating metal layer and the insulating ceramic layer is greater than 0 μm and smaller than or equal to 3 μm, and a thickness scope of the electrodeposition insulating layer is greater than 0 μm and smaller than or equal to 500 μm.

To achieve another objective of the invention, a manufacturing method for a composite insulating layer is provided and comprises steps of disposing a connection layer on a socket substrate; disposing a conductive metal layer on the connection layer; and disposing an electrodeposition layer on the conductive metal layer.

Preferably, the electrodeposition insulating layer is formed on the conductive metal layer through an electrodeposition manner, and a material of the electrodeposition insulating layer comprises one of an epoxy resin, an acrylic resin, an acrylic compound, a polyurethane or a combination thereof.

Preferably, the composite insulating layer further comprises an insulating metal layer that is disposed between the conductive metal layer and the electrodeposition insulating layer. The composite insulating layer further comprises an insulating ceramic layer that is disposed between the insulating metal layer and the electrodeposition insulating layer.

Preferably, the composite insulating layer further comprises an insulating ceramic layer that is disposed between the conductive metal layer and the electrodeposition insulating layer.

Preferably, the a thickness scope of the connection layer is greater than 0 μm and smaller than or equal to 1 μm; and a thickness scope of one of the conductive metal layer, the insulating metal layer and the insulating ceramic layer is greater than 0 μm and smaller than or equal to 3 μm, and a thickness scope of the electrodeposition insulating layer is greater than 0 μm and smaller than or equal to 500 μm.

The composite insulating layer and its manufacturing method provided by the invention have the following advantages:

(1) The composite insulating layer of the invention is disposed on a surface of the socket substrate one by one. The insulating layer disposed on the surface of the socket substrate takes metal oxide layers and carbide layers as insulation cladding. The metal oxide layer and carbide layers are hard and solid and easily cracked to worsen insulation. The invention uses the electrodeposition insulating layer to clad the following layers so as to form the composite insulating layer. It does not only fill and reinforce the crevices of the lower layer structures, but also effectively prevents electromagnetic interference generated between CPU pins.

(2) In the composite insulating layer made of the manufacturing method for composite insulating layer, the electrodeposition insulating layer can effectively overcome significant electromagnetic interference generated between CPU pins during the operation of ICs (intergrated circuit), thereby enhancing the stability of the CPU.

DETAILED DESCRIPTION OF THE PREFERRED EMBODIMENTS

The foregoing and other technical characteristics of the present invention will become apparent with the detailed description of the preferred embodiments and the illustration of the related drawings.

Figure 1:
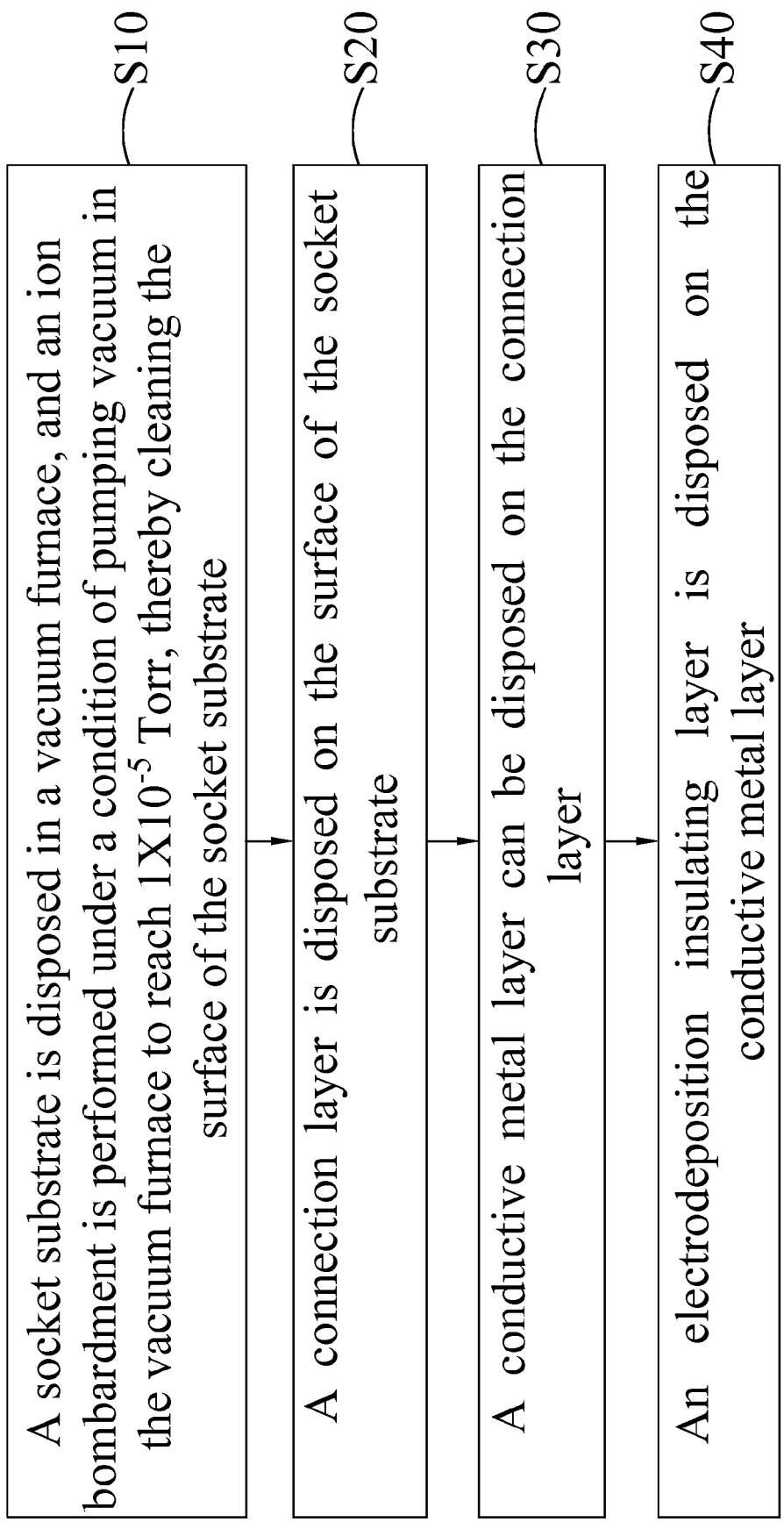
FIG. 1 is a flowchart of a manufacturing method according to a first embodiment of the invention.

With reference to FIG. 1 for a flowchart of a composite insulating layer capable of preventing electromagnetic interference according to a first embodiment of the invention is depicted. A socket substrate is disposed in a vacuum furnace, and an ion bombardment is performed under a condition of pumping vacuum in the vacuum furnace to reach $1\times10^{-5}$ Torr, thereby cleaning the surface of the socket substrate (S10).

After performing step S10, a connection layer is disposed on the surface of the socket substrate (step S20), and the foregoing step is a basement step. The purpose is to improve the adhesion force of a coating layer (Cu), an insulating metal layer and an insulating ceramic layer subsequently. The step is implemented under a condition of returning the vacuum degree within the vacuum furnace to reach $1\times10^{-3}$ to $10^{-5}$ Torr. The working gas-argon (Ar) is continuously introduced into the vacuum furnace, and a titanium target is sputtered at medium frequency. The medium frequency sputtering can be between 5 KHz to 100 KHz. When particles with high energy hit the titanium target, molecules or atoms in the titanium target fly due to the collision of argon ions (Ar+) such that flown molecules or atoms then hit the socket substrate to accumulate a titanium film that is the connection layer.

The socket substrate in the embodiment is a socket in a CPU. The socket substrate can, but not limited to, be components with other materials such as metal, resin or glass and the like. In the process of adopting ions to hit the surface of the socket, accelerated positive ions are utilized to impact the socket substrate such that steam on the surface can be lowered, and substances which are not easily vapored can be transformed into gas to further remove dirt on its surface, thereby obtaining a cleaner surface. Thus, the connection layer in the embodiment can facilitate forming the film with abrasion resistance, erosion resistance and thermal resistance on the surface of the socket substrate.

After performing step S20, a conductive metal layer can be disposed on the connection layer (step S30). A pure metal is coated by mixing medium frequency sputtering and multiple arc ions. The medium frequency sputtering can be between 5 KHz and 100 KHz. The conductive metal layer can be adopted with better conductive metals, such as copper (Cu), silver (Ag), gold (Au) and the like, to prevent electromagnetic conduction. The embodiment takes a copper layer as the conductive metal layer, but not limiting the embodiment.

After performing step S30, an electrodeposition insulating layer is disposed on the conductive metal layer by using electrodeposition manner (step S40). The electrodeposition layer is a key technical feature of the invention. The electrodeposition material adopted therein can be an epoxy resin material, acrylic resin material, but not limiting the embodiment.

Figure 9:
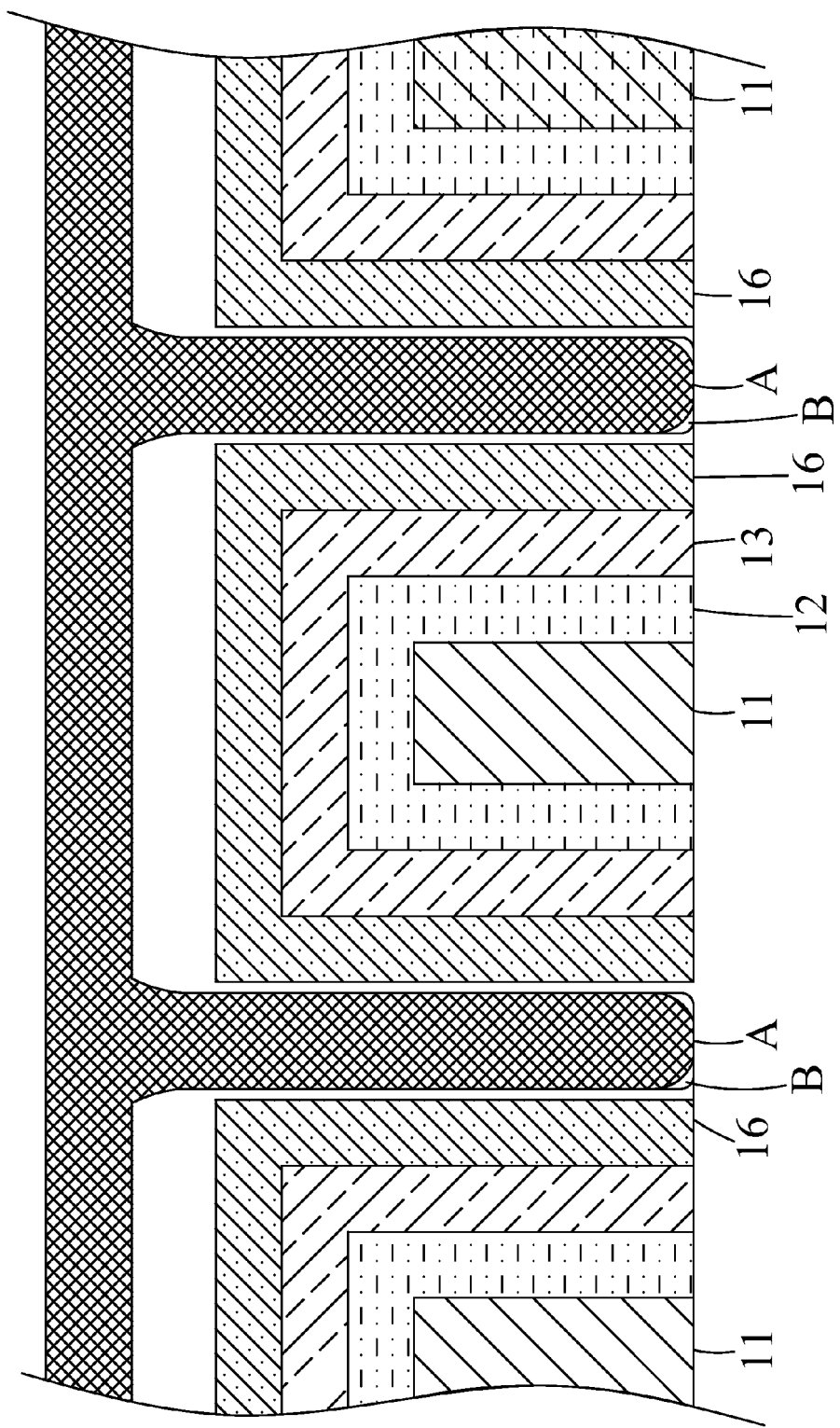
FIG. 9 is a structural cross-sectional drawing of assembling CPU sockets with CPU pins for a composite insulating layer according to the invention.
Figure 10:
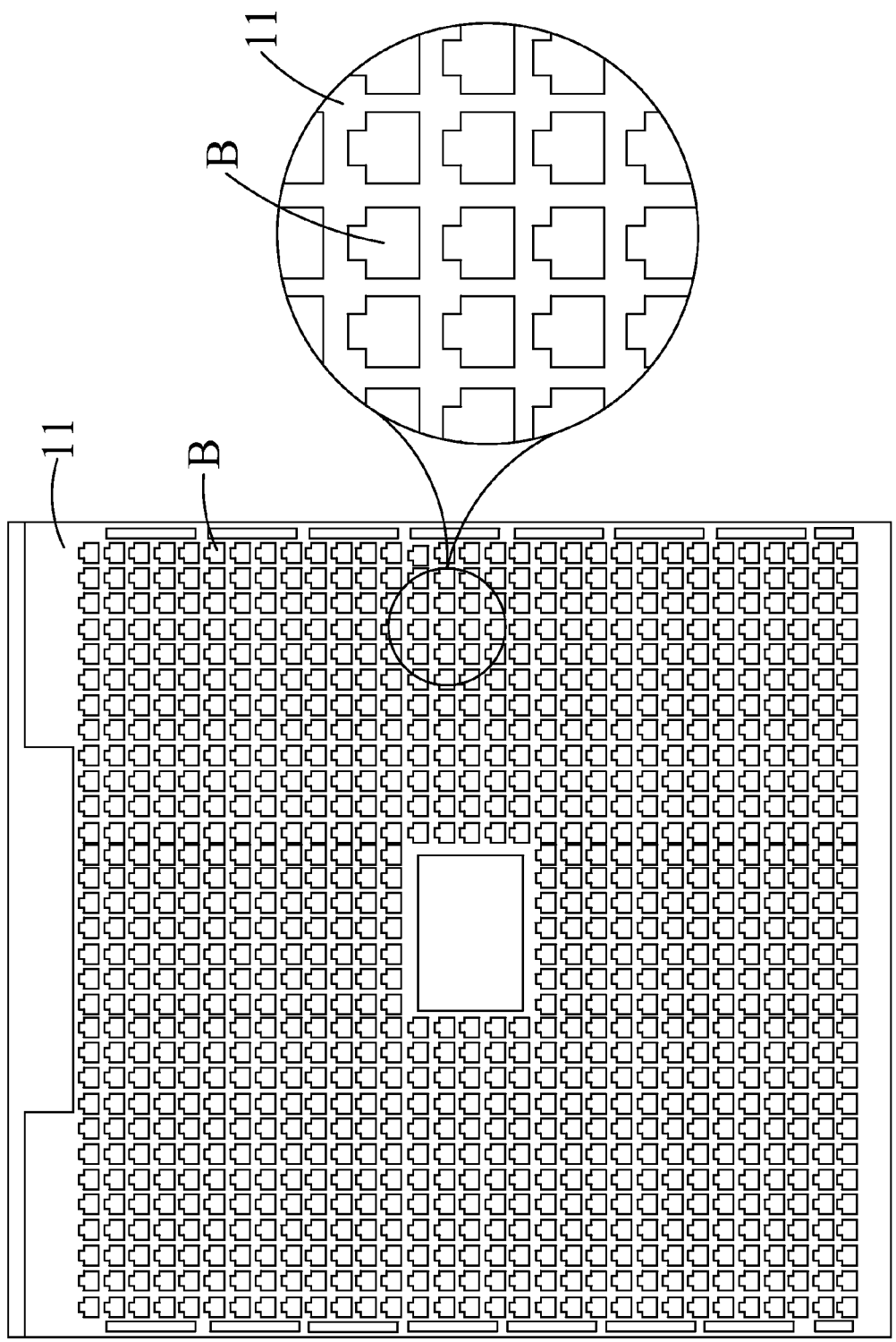
FIG. 10 is a schematic diagram of a composite insulating layer applied to CPU sockets according to the invention.

The steps of disposing the electrodeposition insulating layer on the conductive metal layer are depicted as the following:

The socket substrate that has been completed with steps S10 to S30 is treated with electrodeposition. The socket substrate is disposed to a negative electrode and immersed into electrolyte containing electrodeposition paint. The electrodeposition paint used in the embodiment is epoxy resin that forms the electrodeposition insulating layer on the surface of the socket substrate through electrodeposition treatment. The voltage imposed in the electrodeposition process can be between 50V and 400V. The positive ions of the electrodeposition paint in the electrolyte moves toward the socket substrate (the negative electrode) during the voltage-imposing period, and a thinner layer of electrodeposition paint layer is plated thereon. The thickness of the electrodeposition paint layer is gradually thickened as the electrodeposition time is increased. Electrodeposition is then performed until the thickness of the electrodeposition paint layer no longer increases, the electrodeposition process is then completed. The thickness of the electrodeposition paint layer may not be increased even if the socket substrate that has already been completed with the electrodeposition process is continuously electrified. With reference to FIG. 9 to FIG. 10, at this time, the outermost surface of the socket substrate 11 is the electrodeposition insulating layer 16. The electrodeposition insulating layer 16 in the embodiment can effectively prevent electromagnetic interference between CPU pins A.

Figure 2:
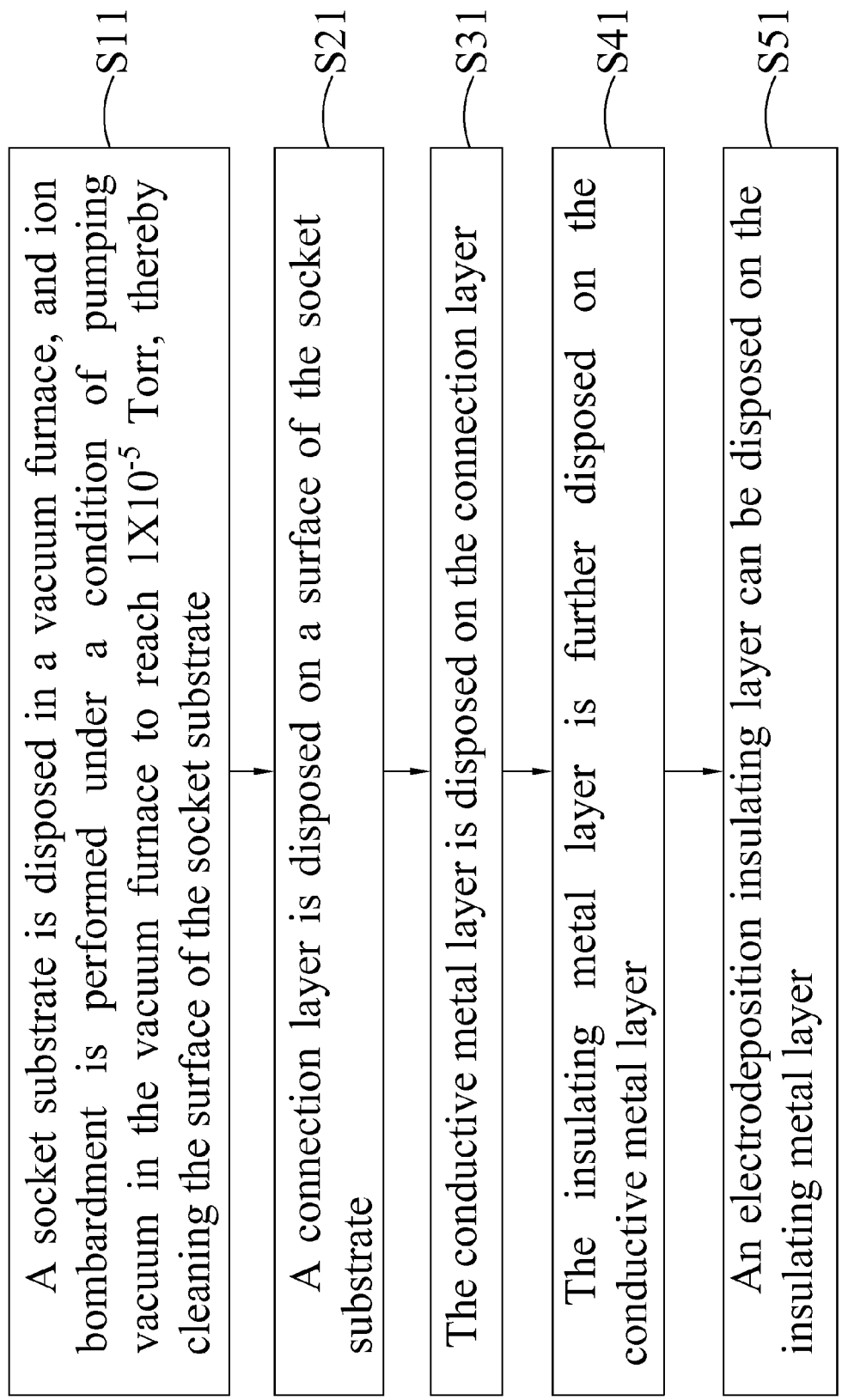
FIG. 2 is a flowchart of a manufacturing method according to a second embodiment of the invention.

With reference to FIG. 2 for a flowchart of a manufacturing method for composite insulating layer capable of preventing electromagnetic interference according to a second embodiment of the invention is depicted. The embodiment is another type according to the foregoing first embodiment and to dispose the insulating metal layer between the conductive metal layer and the electrodeposition insulating layer.

In the figure, steps S11 to S31 of the embodiment are the same as the steps S10 to S30 of the first embodiment. Firstly, a socket substrate is disposed in a vacuum furnace, and ion bombardment is performed under a condition of pumping vacuum in the vacuum furnace to reach 1×10-5 Torr, thereby cleaning the surface of the socket substrate (a step S11).

After performing the step S11, a connection layer is disposed on a surface of the socket substrate (a step S21). After performing the step S21, the conductive metal layer is disposed on the connection layer (a step S31). After performing the step S31, the insulating metal layer is further disposed on the conductive metal layer (a step S41). In the step S41, medium frequency sputtering and multiple arc ions can be used to mix with and coat an oxidized metal on the conductive metal layer. Disposition of the insulating metal layer does not completely insulate, the conductivity between CPU pins A can be reduced, and its surface rigidity and abrasion resistance can be improved. The oxidized metal can include copper oxide. The utilized medium frequency sputtering can be between 5 KHz and 100 KHz. In addition, in the step S41, a working gas (oxygen) is introduced into the vacuum furnace to perform the process for the oxidized metal film.

After performing the step S41, an electrodeposition insulating layer can be disposed on the insulating metal layer by using electrodeposition manner (step S51). In the step S41, disposition of the insulating metal layer does not completely insulate, the conductivity between CPU pins A can be reduced, and its surface rigidity and abrasion resistance can be improved. Therefore, the electrodeposition insulating layer is disposed on the insulating metal layer. The used electrodeposition material can, but not limited to, be an epoxy resin material or an acrylic resin material.

Figure 3:
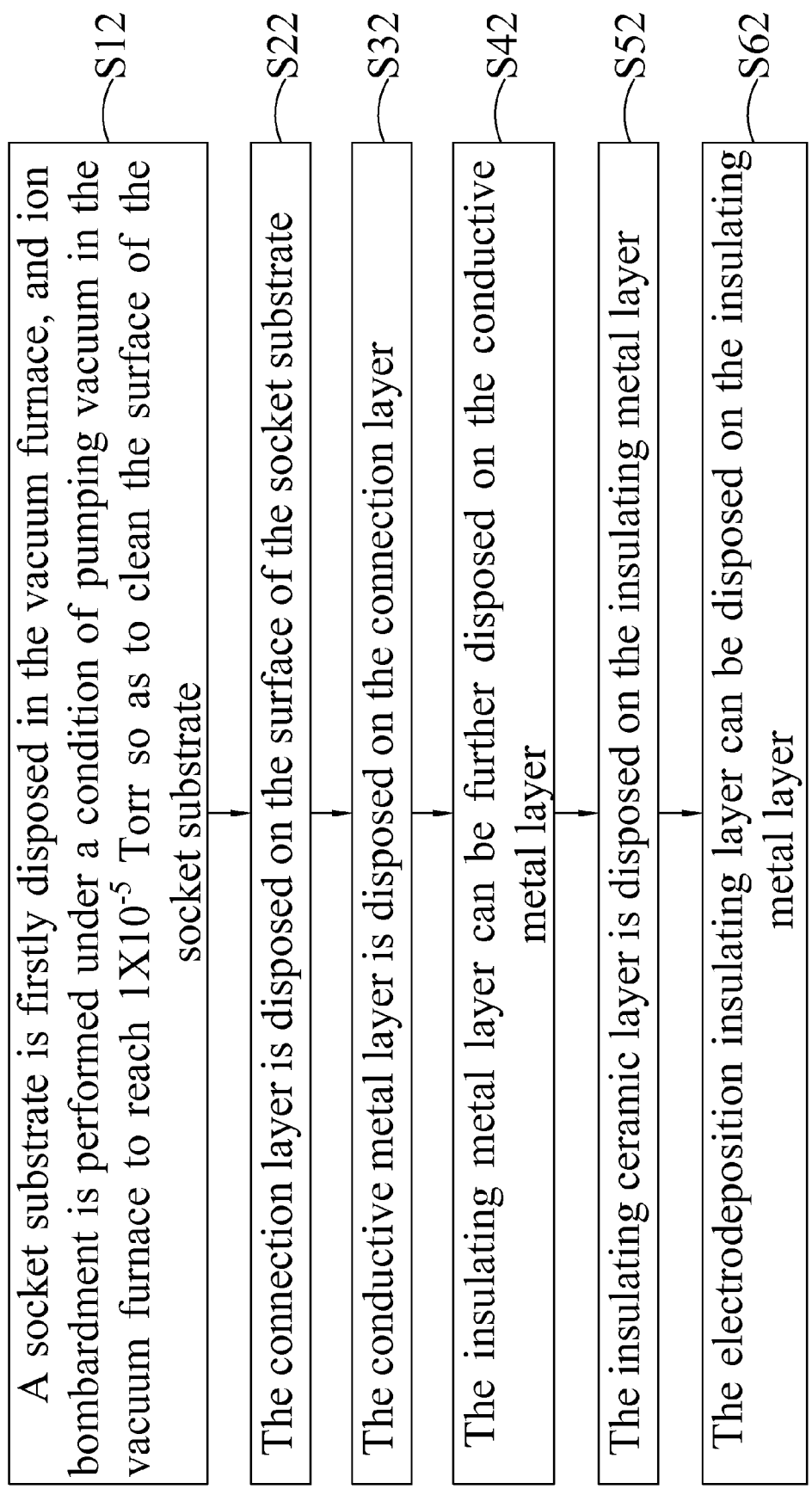
FIG. 3 is a flowchart of a manufacturing method according to a third embodiment of the invention.

With reference to FIG. 3 for a flowchart of a composite insulating layer and a manufacturing method capable of preventing electromagnetic interference is depicted. The embodiment is another type of the second embodiment, an insulating ceramic layer is further disposed between the insulating metal layer and the electrodeposition insulating layer.

The steps S12 to S42 in the embodiment are the same as the steps S11 to S41 in the second embodiment. Similarly, a socket substrate is firstly disposed in the vacuum furnace, and ion bombardment is performed under a condition of pumping vacuum in the vacuum furnace to reach $1×10^{-5}$ Torr so as to clean the surface of the socket substrate (the step S12).

After performing the step S12, the connection layer is disposed on the surface of the socket substrate (the step S22). After performing the step S22, the conductive metal layer is disposed on the connection layer (the step S32). After performing the step 32, the insulating metal layer can be further disposed on the conductive metal layer (the step S42). After performing the step S42, the insulating ceramic layer is disposed on the insulating metal layer (the step S52). A carbonized metal can be coated by mixing the medium frequency sputtering with multiple arc ions. The medium frequency can be between 5 KHz and 100 KHz, and a working gas as acetylene (C.sub.2H.sub.2) is introduced into the vacuum furnace to perform the process of the insulating ceramic layer. The embodiment takes titanium carbide (Tic) ceramic film as the insulating ceramic layer that can, but not limited to, have advantages of scratch resistance and reinforcement. In the step S42 and the step S52, disposition of the insulating metal layer and the insulating ceramic layer does not cause complete insulation between CPU pins A but merely reduces the conductivity between CPU pins A and improves the surface rigidity, scratch resistance and reinforcement.

After performing the step S52, the electrodeposition insulating layer can be disposed on the insulating metal layer by using the electrodeposition manner (a step S62). The electrodeposition material adopted in the embodiment can, but not limited to, be an epoxy resin material or an acrylic resin material.

Figure 4:
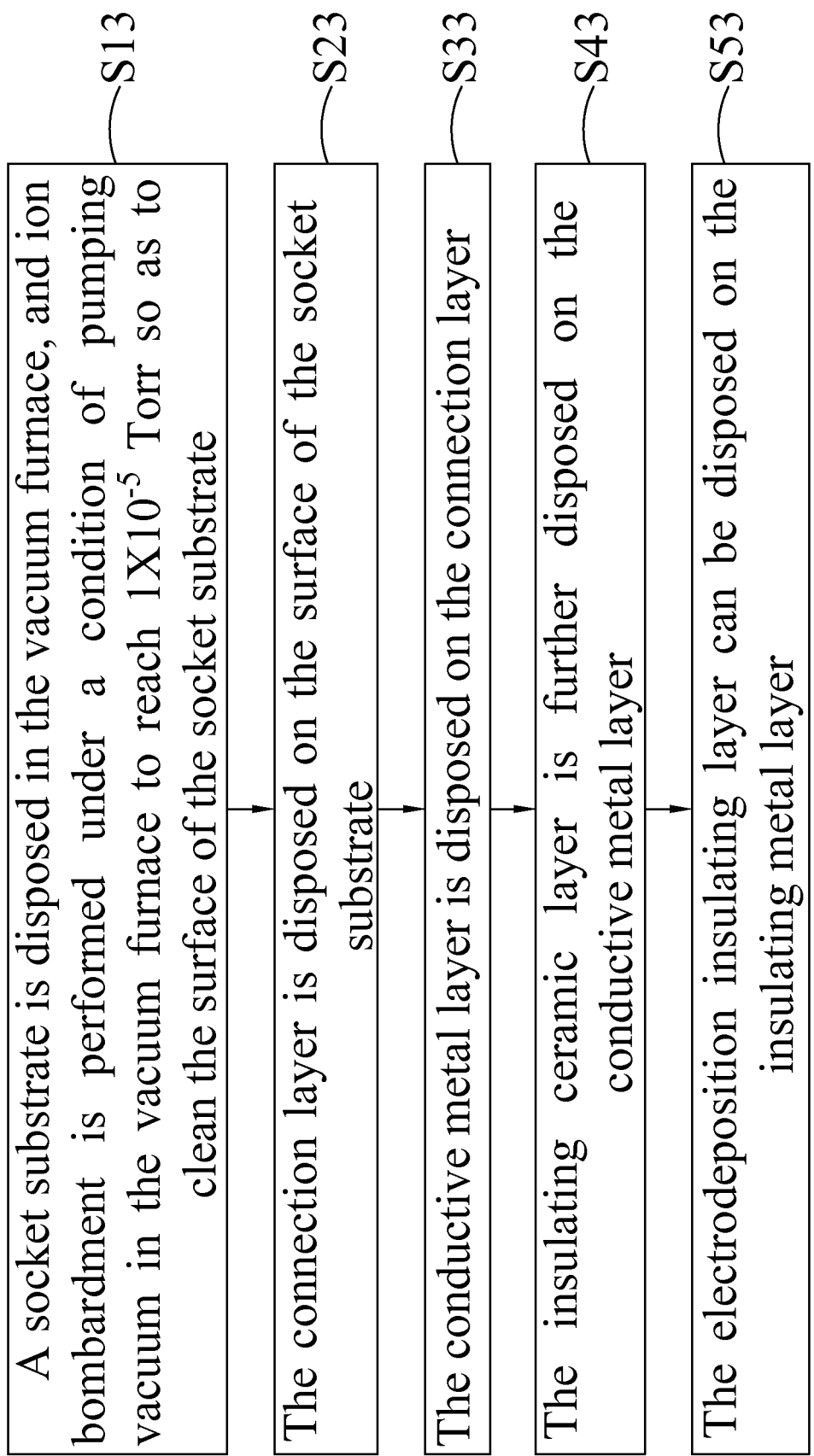
FIG. 4 is a flowchart of a manufacturing method according to a fourth embodiment of the invention.

With reference to FIG. 4 for a flowchart of a composite insulating layer and its manufacturing method capable of preventing electromagnetic interference according to a fourth embodiment of the invention is depicted. The embodiment is a further type according to the first embodiment and to dispose the insulating ceramic layer between the conductive metal layer and the electrodeposition insulating layer.

In the figure, the steps S13 to S33 of the embodiment are the same as the steps S10 to S30 of the first embodiment. Firstly, a socket substrate is disposed in the vacuum furnace, and ion bombardment is performed under a condition of pumping vacuum in the vacuum furnace to reach 1×10-5 Torr so as to clean the surface of the socket substrate (the step S13).

After performing the step S13, the connection layer is disposed on the surface of the socket substrate (the step S23). After performing the step S23, the conductive metal layer is disposed on the connection layer (the step S33). After performing the step S33, the insulating ceramic layer is further disposed on the conductive metal layer (the step S43). A carbonized metal can be coated by mixing the medium frequency sputtering with multiple arc ions. The medium frequency can be between 5 KHz and 100 KHz, and a working gas as acetylene (C.sub.2H.sub.2) is introduced into the vacuum furnace to perform the process of the insulating ceramic layer. The embodiment takes titanium carbide (Tic) ceramic film as the insulating ceramic layer that can have scratch resistance and reinforcement.

After performing the step S43, the electrodeposition insulating layer can be disposed on the insulating metal layer by using the electrodeposition manner (a step S53). The electrodeposition material adopted in the embodiment can, but not limited to, be an epoxy resin material or an acrylic resin material.

Furthermore, an ultraviolet (UV) paint insulating layer can be disposed on the electrodeposition insulating layer of each embodiment, wherein the material of the adopted ultraviolet paint insulating layer can be an acrylic acid compound. The socket substrate, which has been completed with electrodeposition treatment, is immersed into the UV glue/paint. The socket substrate then is taken out after it is completely immersed. The UV glue attached to the surface and pores of the socket substrate is blown away by a high pressure air gun to remain a thinner UV glue layer on its surface. Since right angles at pores are easily filled by the UV glue to form R angles, it may need blowing treatment for many times. Finally, an UV lamp irradiates the UV glue to solidify the UV glue, wherein the irradiation wavelength is about 365 nm. The foregoing step is repeated for three times to ensure that the UV glue can be attached to the socket substrate. After the UV glue is completely dried, the UV paint insulating layer is formed on the electrodeposition insulating layer.

Figure 5:
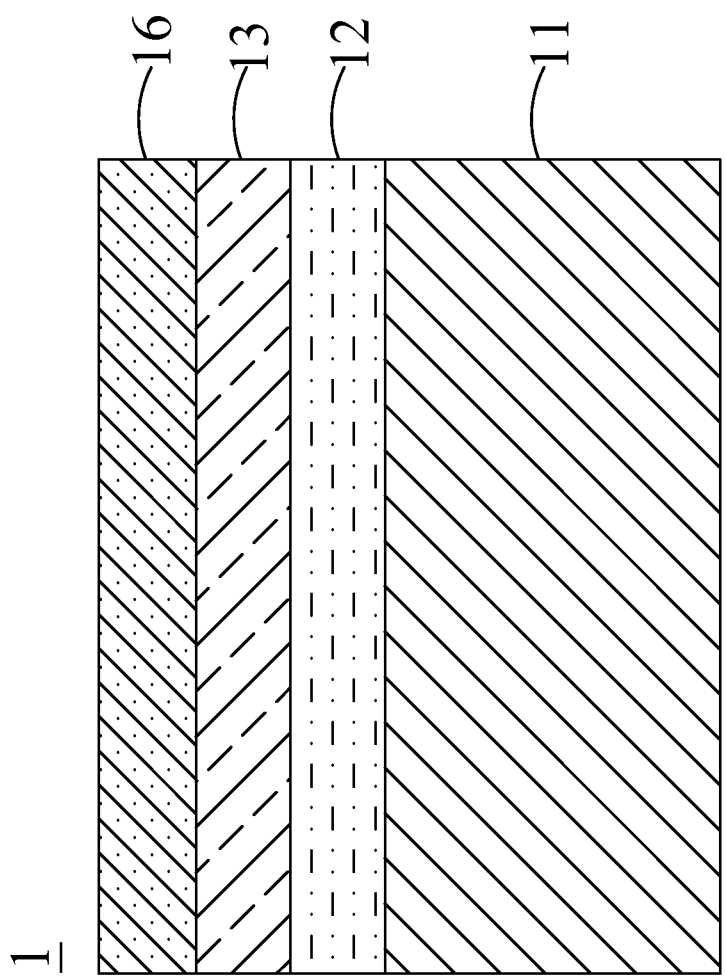
FIG. 5 is a structural cross-sectional drawing according to a first embodiment of the invention.

With reference to FIG. 5 for a structural cross-sectional drawing of a composite insulating layer capable of preventing electromagnetic interference according to a first embodiment of the invention is depicted. With the manufacturing method for the composite insulating layer shown in FIG. 1, the connection layer 12 is disposed on the socket substrate 11. The conductive metal layer 13 is disposed on the connection layer 12. The electrodeposition insulating layer 16 is disposed on the conductive metal layer 13. Each layer is disposed on the socket substrate 11 one by one. The composite insulating layer 1 made of the manufacturing method for composite insulating layer has the function of preventing electromagnetic interference.

The socket substrate 11 adopted in the embodiment can be components with other materials such as metal, resin or glass. The socket B of the CPU can be inserted by each pin A of the CPU. The connection layer 12 takes titanium as the base layer. The titanium connection layer 12 disposed on the socket substrate 11 can improve subsequent attachment force of the film coating layer and the plastic. The conductive metal layer 13 can adopt one of copper, silver, gold or combination thereof. The conductive metal layer 13 having copper is disposed on the titanium connection layer 12. The thickness of the electrodeposition insulating layer 16 of the invention is greater than 0 μm and smaller then and equal to 500 μm. The thicknesses of the connection layer, the conductive metal layer and the electrodeposition insulating layer can be regulated upon demands. Further, the thickness of each layer can be regulated according to EMI effect generated by electronic products to effectively prevent electromagnetic interference, thereby effectively improving the stability of the CPU. The thickness scope of the connection layer, the conductive metal layer, the insulating metal layer and the insulating ceramic layer is larger than 0 μm and smaller than or equal to 3 μm.

Figure 6:
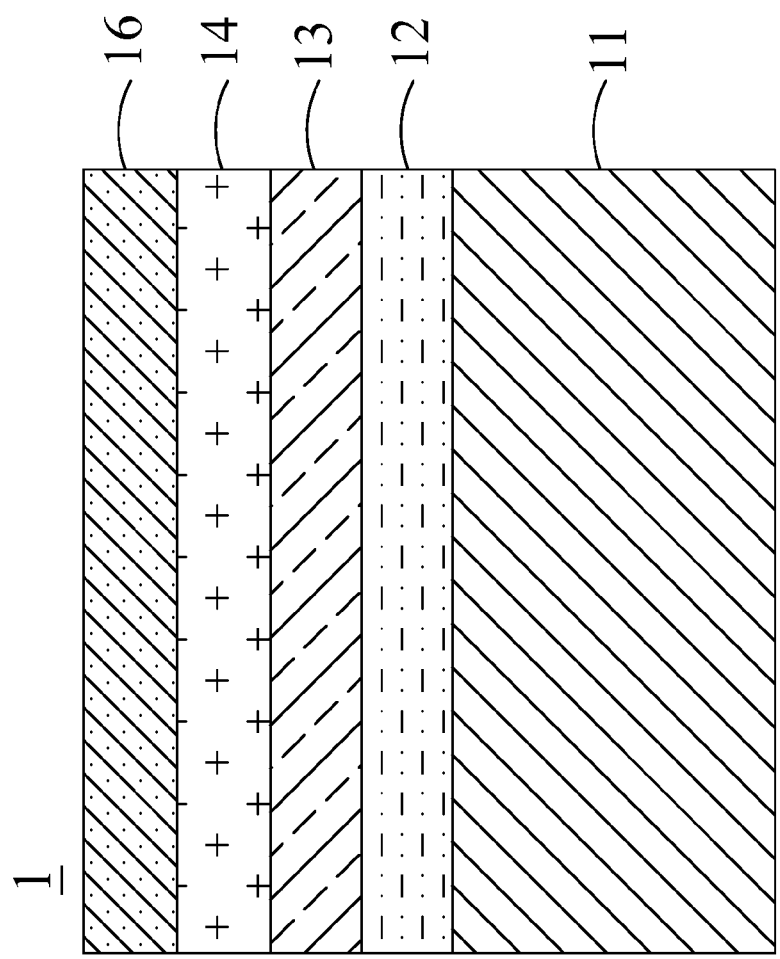
FIG. 6 is a structural cross-sectional drawing according to a second embodiment of the invention.

With reference to FIG. 6 for a structural cross-sectional diagram of a composite insulating layer capable of preventing electromagnetic interference according to a second embodiment of the invention is depicted. With the manufacturing method for the composite insulating layer shown in FIG. 2, the connection layer 12 is disposed on the socket substrate 11. The conductive metal layer 13 is disposed on the connection layer 12. The insulating metal layer 14 is disposed on the conductive metal layer 13. The electrodeposition insulating layer 16 is disposed on the insulating metal layer 14. Each layer is disposed on the socket substrate 11 one by one. In the embodiment, copper oxide is taken as the insulating metal layer 14. The thickness scope of the electrodeposition insulating layer 16 is greater than 0 μm and smaller than and equal to 500 μm, and each thickness scope of the connection layer, the conductive metal layer, the insulating metal layer and the insulating ceramic layer is greater than 0 μm and smaller than or equal to 3 μm.

Figure 7:
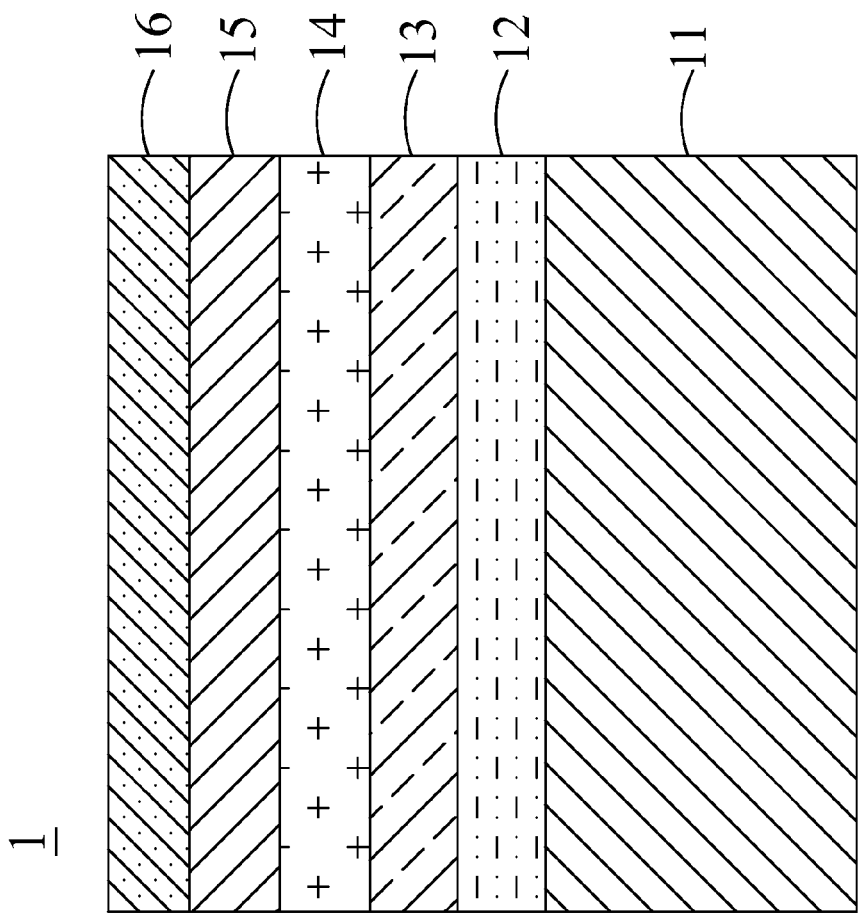
FIG. 7 is a structural cross-sectional drawing according to a third embodiment of the invention.

With reference to FIG. 7 for a structural cross-sectional drawing of a composite insulating layer capable of preventing electromagnetic interference according to a third embodiment of the invention is depicted. With the manufacturing method for the composite insulating layer shown in FIG. 3, the connection layer 12 is disposed on the socket substrate 11. The conductive metal layer 13 is disposed on the connection layer 12. The insulating metal layer 14 is disposed on the conductive metal layer 13. The insulating ceramic layer 15 is disposed on the insulating ceramic layer 14. The electrodeposition insulating layer 16 is disposed on the insulating ceramic layer 15. Each layer is disposed on the socket substrate 11 one by one. The embodiment can adopt copper oxide as the insulating metal layer 14 and carbonized titanium (TiC) as the insulating ceramic layer 15. The electrodeposition insulating layer 16 of the invention is used for filling and reinforcing crevices of the ceramic layer 15 and has a better function of preventing electromagnetic interference. The thicknesses of the connection layer, the conductive metal layer, the insulating metal layer, the insulating ceramic layer or the electrodeposition insulating layer can be regulated upon actual demands, and the thickness of each layer can be regulated according to EMI effect generated by electronic products so that electromagnetic interference can be effectively prevented, and the stability of the CPU can be effectively improved. The thickness scope of the connection layer, the conductive metal layer, the insulating metal layer and the insulating ceramic layer of the embodiment is greater than 0 μm and smaller than or equal to 3 μm.

Figure 8:
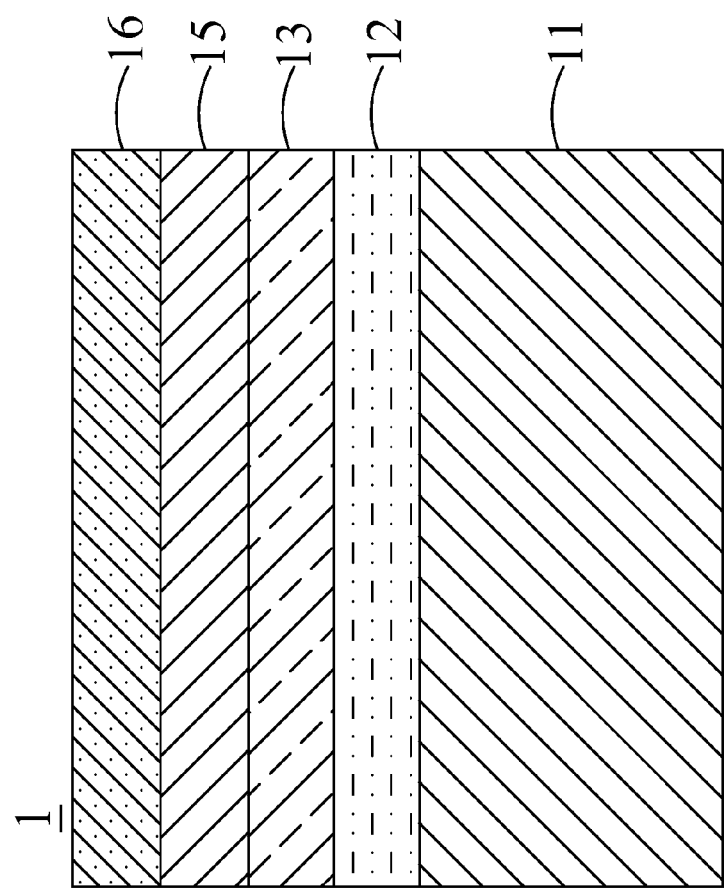
FIG. 8 is a structural cross-sectional drawing according to a fourth embodiment of the invention.

With reference to FIG. 8 for a structural cross-sectional drawing of a composite insulating layer capable of preventing electromagnetic interference according to a fourth embodiment of the invention is depicted. With the manufacturing method for the composite insulating layer shown in FIG. 4, the connection layer 12 is disposed on the socket substrate 11. The conductive metal layer 13 is disposed on the connection layer 12. The insulating ceramic layer 15 is disposed on the conductive metal layer 13. The electrodeposition insulating layer 16 is disposed on the insulating ceramic layer 15.

With reference to FIG. 10 for a appearance figure of substrate surfaces of disposing the electrodeposition insulating layer 16 at the outermost surface of the socket substrate 11. FIG. 9 is a structural cross-sectional drawing according to FIG. 10. When CPU pins A are inserted into corresponding sockets B, EMI effect generated between pins A can be effectively reduced due to the electrodeposition insulating layer 16 having an effect of isolating electromagnetic wave between pins A. Thus, unstable phenomenon generated by the CPU at high speed operation can be improved to further increase the stability of the whole CPU.

In addition, since the electrodeposition insulating layer is disposed on the outside of the conductive metal layer on the exterior of the socket substrate, electromagnetic wave effect generated between pins can be effectively isolated. It has the function of isolating electromagnetic wave even though other insulating layers or protection films are additionally disposed at the exterior of the electrodeposition insulating layer. For example, one of the insulating metal layers, the insulating ceramic layer or the UV paint insulating layer or the foregoing combination is disposed on the electrodeposition insulating layer to have excellent effect of isolating electromagnetic wave.

The electrodeposition insulating layer of the invention can be applied to sockets of ICs and CPUs to effectively isolate electromagnetic wave effect. A producer properly regulates and changes the product made of the composite insulating layer of the invention according to market demands, thereby having high product competition capability.

The invention improves over the prior art and complies with patent application requirements, and thus is duly filed for patent application. While the invention has been described by device of specific embodiments, numerous modifications and variations could be made thereto by those generally skilled in the art without departing from the scope and spirit of the invention set forth in the claims.

What is claimed is:

1. A manufacturing method for a composite insulating layer comprising:
    disposing a connection layer with a material of titanium on a socket substrate with a material of resin or glass, wherein the socket substrate has a plurality of sockets for inserting pins of CPU;
    disposing a conductive metal layer on the connection layer; and
    disposing an electrodeposition insulating layer on the conductive metal layer,
    wherein the connection layer is connected between the socket substrate and the conductive metal layer.

2. The manufacturing method for the composite insulating layer as recited in claim 1, wherein the electrodeposition insulating layer is formed on the conductive metal layer through an electrodeposition manner, and a material of the electrodeposition insulating layer comprises one of an epoxy resin, an acrylic resin, an acrylic compound, a polyurethane or a combination thereof.

3. The manufacturing method for the composite insulating layer as recited in claim 2, wherein the composite insulating layer is to further dispose an insulating metal layer between the conductive metal layer and the electrodeposition insulating layer.

4. The manufacturing method for the composite insulating layer as recited in claim 3, wherein the composite insulating layer is to further dispose an insulating ceramic layer between the insulating metal layer and the electrodeposition insulating layer.

5. The manufacturing method for the composite insulating layer as recited in claim 4, wherein a thickness scope of the connection layer is greater than 0 μm and smaller than or equal to 1 μm; and a thickness scope of one of the conductive metal layer, the insulating metal layer and the insulating ceramic layer is greater than 0 μm and smaller than or equal to 3 μm, and a thickness scope of the electrodeposition insulating layer is greater than 0 μm and smaller than or equal to 500 μm.

6. The manufacturing method for the composite insulating layer as recited in claim 2, wherein the composite insulating layer is to further dispose an insulating ceramic layer between the conductive metal layer and the electrodeposition insulating layer.

7. The manufacturing method for the composite insulating layer as recited in claim 1, wherein the composite insulating layer is to further dispose an insulating metal layer between the conductive metal layer and the electrodeposition insulating layer.

8. The manufacturing method for the composite insulating layer as recited in claim 7, wherein the composite insulating layer is to further dispose an insulating ceramic layer between the insulating metal layer and the electrodeposition insulating layer.

9. The manufacturing method for the composite insulating layer as recited in claim 8, wherein a thickness scope of the connection layer is greater than 0 μm and smaller than or equal to 1 μm; and a thickness scope of one of the conductive metal layer, the insulating metal layer and the insulating ceramic layer is greater than 0 μm and smaller than or equal to 3 μm, and a thickness scope of the electrodeposition insulating layer is greater than 0 μm and smaller than or equal to 500 μm.

10. The manufacturing method for the composite insulating layer as recited in claim 1, wherein the composite insulating layer is to further dispose an insulating ceramic layer between the conductive metal layer and the electrodeposition insulating layer.

* * * * *